United States Patent
Fischer et al.

(10) Patent No.: US 9,799,554 B2
(45) Date of Patent: Oct. 24, 2017

(54) METHOD FOR COATING A SUBSTRATE

(71) Applicant: SUSS MicroTec Lithography GmbH, Garching (DE)

(72) Inventors: Katrin Fischer, Stuttgart (DE); Florian Palitschka, Gauting (DE); Darren Robert Southworth, Munich (DE); William Whitney, Monkton, VT (US)

(73) Assignee: SUSS MicroTec Lithography GmbH (DE)

( * ) Notice: Subject to any disclaimer, the term of this patent is extended or adjusted under 35 U.S.C. 154(b) by 0 days.

(21) Appl. No.: 15/093,834

(22) Filed: Apr. 8, 2016

(65) Prior Publication Data
US 2016/0300759 A1     Oct. 13, 2016

(30) Foreign Application Priority Data
Apr. 8, 2015  (NL) ..................... 2014598

(51) Int. Cl.
*H01L 21/48*   (2006.01)
*H01L 21/768*  (2006.01)
*H01L 21/02*   (2006.01)

(52) U.S. Cl.
CPC .. *H01L 21/76831* (2013.01); *H01L 21/02118* (2013.01); *H01L 21/02282* (2013.01); *H01L 21/02307* (2013.01); *H01L 21/02315* (2013.01); *H01L 21/76898* (2013.01)

(58) Field of Classification Search
CPC ............. H01L 21/02282; H01L 21/486; H01L 21/76877
See application file for complete search history.

(56) References Cited

U.S. PATENT DOCUMENTS

| | | | | |
|---|---|---|---|---|
| 5,820,679 A | * | 10/1998 | Yokoyama | C23C 14/568 118/719 |
| 5,993,546 A | | 11/1999 | Sugai | |
| 2004/0224479 A1 | * | 11/2004 | Cui | H01L 21/76229 438/436 |
| 2009/0047781 A1 | * | 2/2009 | Pratt | H01L 21/76898 438/667 |
| 2015/0008587 A1 | * | 1/2015 | Lin | H01L 21/486 257/774 |
| 2015/0014815 A1 | * | 1/2015 | Schmidt | H01L 29/0638 257/536 |

FOREIGN PATENT DOCUMENTS

| | | |
|---|---|---|
| JP | H1330674 | 11/1999 |
| WO | 2008123049 A1 | 10/2008 |
| WO | 2009050207 A1 | 4/2009 |
| WO | 2010023156 A1 | 3/2010 |
| WO | 2014170928 A1 | 10/2014 |

* cited by examiner

*Primary Examiner* — Jae Lee
(74) *Attorney, Agent, or Firm* — Hayes Soloway PC

(57) ABSTRACT

A method for coating substrates provided with vias uses a first step in which the substrate is conditioned and a second step in which the substrate is coated with an electrically insulating material such that the vias are filled up completely.

19 Claims, 3 Drawing Sheets

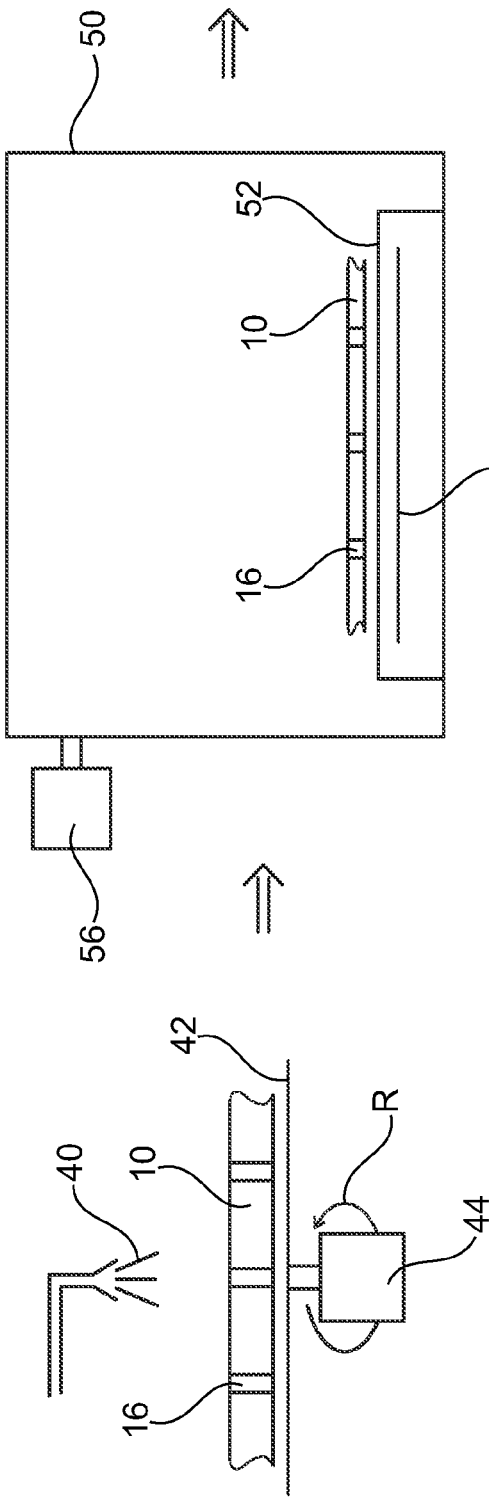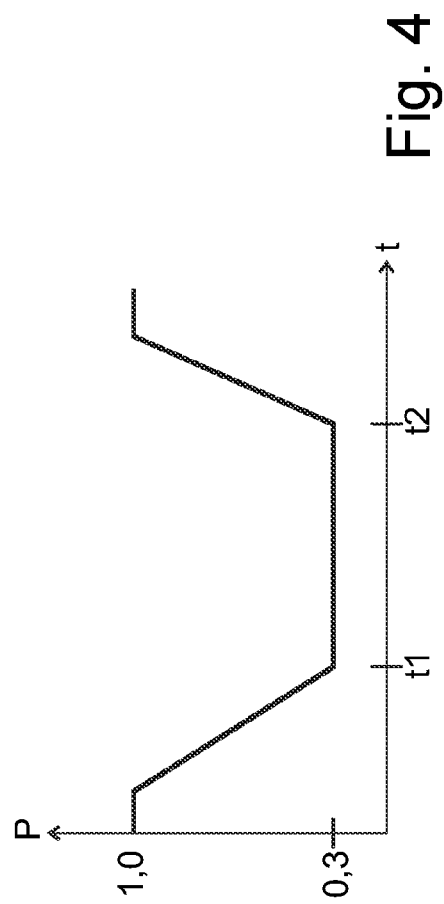

METHOD FOR COATING A SUBSTRATE

The invention relates to a method for coating a substrate provided with vias The substrate to be coated is in particular a microstructured wafer, for example of a semiconductor material.

BACKGROUND OF THE INVENTION

The vias are depressions in the substrate for connecting electrically conductive structures on one side of the substrate to electrically conductive structures arranged on the other side of the substrate. In this way, three-dimensional components can be produced, for example MCPs (multi-chip packages) or MEMSs (microelectromechanical systems).

The vias may be formed as openings which make it possible to connect one side of the substrate to the other, or as blind holes which form a connection from one side of the substrate to a component which is arranged on the other side and which closes the via. The electrical contacting is provided by an electrically conductive layer (for example of copper) located on the wall of the via.

To shield and/or electrically insulate this electrically conductive layer, an electrically insulating material may be applied to the substrate. Said material covers the electrical conductors on the substrate and also fills up the vias.

For subsequent treatment steps, it is desirable for the electrically insulating material to have as flat and planar a surface as possible. A surface of this type is not simple to achieve, in particular in the region of the vias, since the vias have a very large depth by comparison with the diameter, meaning that they can only be filled poorly with the electrically insulating material.

Various approaches for coating a substrate provided with vias uniformly with an electrically insulating material are known in the art. WO 2010/023156 A1 discloses a method in which the substrate is vibrated, assisting the electrically insulating material in flowing into the vias and completely filling them up.

U.S. Pat. No. 5,993,546 discloses a method in which a coating applied to a substrate is subjected to a high pressure in order for the coating to flow into the vias.

However, it has been found that all of these approaches either fail to produce the desired result or are technically complex.

The object of the invention is to provide a method for coating a substrate with an electrically insulating material in which vias provided in the substrate are filled up with the electrically insulating material in such a way that the insulating material has as flat a surface as possible.

BRIEF DESCRIPTION OF THE INVENTION

To achieve this object, the invention provides a method for coating a substrate provided with vias in which the substrate is conditioned in a first step. In a second step, the substrate is coated with an electrically insulating material such that the vias are filled up completely with the electrically insulating material in such a way that the insulating material has as a flat surface. The invention is based on the underlying idea of improving the flowability of the applied coating by conditioning the surface of the substrate, in particular in the region of the vias. This ensures that the electrically insulating coating flows better into the vias and completely fills them up, meaning that the coating substrate subsequently has an (at least almost) flat surface.

The conditioning step preferably takes place at atmospheric pressure. This has the advantage that no complicated apparatuses are required.

In one embodiment of the invention, the substrate is plasma-treated to condition it. This modifies the surface of the substrate in such a way that the flowability of the electrically conductive coating is distinctly improved.

In an alternative embodiment, the substrate is oxidised to condition it. This also makes it possible, in a very simple manner, to modify the surface of the substrate in such a way that the flowability of the electrically insulating coating is improved.

In a further embodiment of the invention, a solvent is applied to the substrate to condition it. This embodiment is based on the finding that wetting the surface of the substrate with the solvent greatly improves the flowability of the electrically insulating coating, in such a way that the coating completely fills vias having a depth which is even more than twice the diameter.

The solvent is preferably applied by spin-coating. In this way, the entire surface of the substrate can be uniformly wetted with the solvent in a simple manner.

In a preferred embodiment of the invention, the substrate provided with the solvent is introduced into a vacuum chamber, the pressure in the vacuum chamber is reduced, and after a holding time the vacuum chamber is ventilated again. This method step is based on the finding that temporarily applying a vacuum improves the penetration of the solvent into the vias. This appears to be because the air bubble which is initially enclosed under the solvent layer in the vias expands during the evacuation, in other words the air bubble migrates upwards, and the solvent is drawn into the via. When the pressure is subsequently increased back to atmospheric pressure, the process of exchanging solvent for air is already complete.

It has been found that no fine vacuum or high vacuum is required for transporting the solvent into the vias. Instead, it is sufficient for the pressure in the vacuum chamber to be reduced from atmospheric pressure by 0.1 to 0.9 bar. A vacuum of this type can be produced in a relatively inexpensive vacuum chamber.

The holding time may be approximately 10 to 60 s, making it possible to implement short process times.

In one embodiment of the invention, the substrate is heated in the vacuum chamber. The substrate is preferably heated to a temperature of >30° C. This improves the exchange of air for solvent in the vias, since the air enclosed under the solvent layer in the via expands even more because of the heating than it already does because of the vacuum.

In the preferred embodiment of the invention, after the solvent has been applied the substrate is transported into another chamber, in which it is coated with the insulating material. This prevents the vacuum chamber from being contaminated with the electrically insulating material.

Preferably, the electrically insulating material is applied by spin-coating. This method is generally established in the field of wafer processing, leading to high process reliability and low costs.

The electrically insulating material may be a resist, an epoxy resin or another dielectric. These materials can be processed well, and a coating having a flat surface can be produced well using said materials.

The insulating material may be cured after application. For this purpose, the substrate may be exposed to UV light or a heat source together with the coating.

BRIEF DESCRIPTION OF THE DRAWINGS

In the following, the invention is disclosed in greater detail with reference to various embodiments, which are shown in the accompanying drawings, in which:

FIG. 3 shows the conditioning step of the method of FIG. 2 in greater detail; and FIG. 4 is a graph showing the pressure progression over time during the conditioning of FIG. 3.

DETAILED DESCRIPTION OF THE INVENTION

Figure 1:
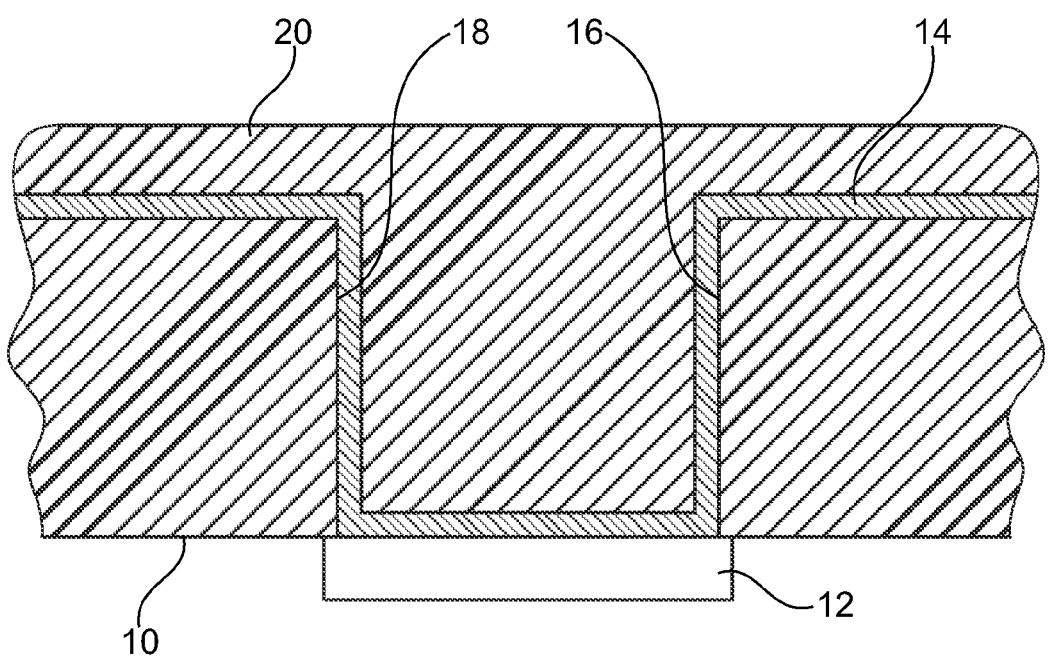
FIG. 1 is a sectional view of part of a coated substrate provided with a via.

FIG. 1 schematically shows a substrate 10 ("wafer"), which may for example consist of a semiconductor material. The substrate 10 may be provided with various electrical or electronic components, of which merely an electrical contact 12 is schematically illustrated in this case.

On the side opposite the contact, the substrate 10 is provided with an electrical conductor 14, which may be formed as a strip conductor or an electrically conductive coating. To connect the contact 12 to the conductor 14, the substrate 10 is provided with a via 16, in other words an opening which extends substantially perpendicularly to the plane of the substrate from at least one surface. In this case, the via 16 is formed as an opening extending from the side of the conductor 14 through the substrate 10 to the contact 12.

Since the via 16 is closed at the underside by the contact 12 in the embodiment shown, it is a blind hole. It is also possible for the via 16 to connect the conductor 14 to a second conductor arranged on the underside of the substrate. In this case, the via would be a through-hole.

The detail of the substrate 10 shown in FIG. 1 merely contains a single via 16. In reality, the substrate is provided with a very large number of vias. When "the" via 16 is being discussed in the following, this also applies to the further vias with which the substrate is provided, which are treated in the same way as the via shown in the drawing.

In this case, the electrical connection between the contact 12 and the conductor 14 is provided by an electrically conductive coating 18 located on the wall of the via 16. The coating 18 may be applied retroactively, to connect the previously applied conductor 14 to the contact 12, or be applied in the same working step as the conductor 14.

The side of the substrate 10 provided with the conductor 14 is coated with an electrically insulating material 20. The material 20 is for electrical insulation and optionally also for shielding. Suitable materials are for example a photoresist (resist), an epoxy resin or another dielectric.

As can be seen in FIG. 1, the electrically insulating material 20 has a planar surface. This is in particular because the electrically insulating material 20 completely fills up the via 16, even though the depth of the via 16 is one to two times the diameter of the via 16 (and in some cases even larger depth ratios may be used).

Figure 2:
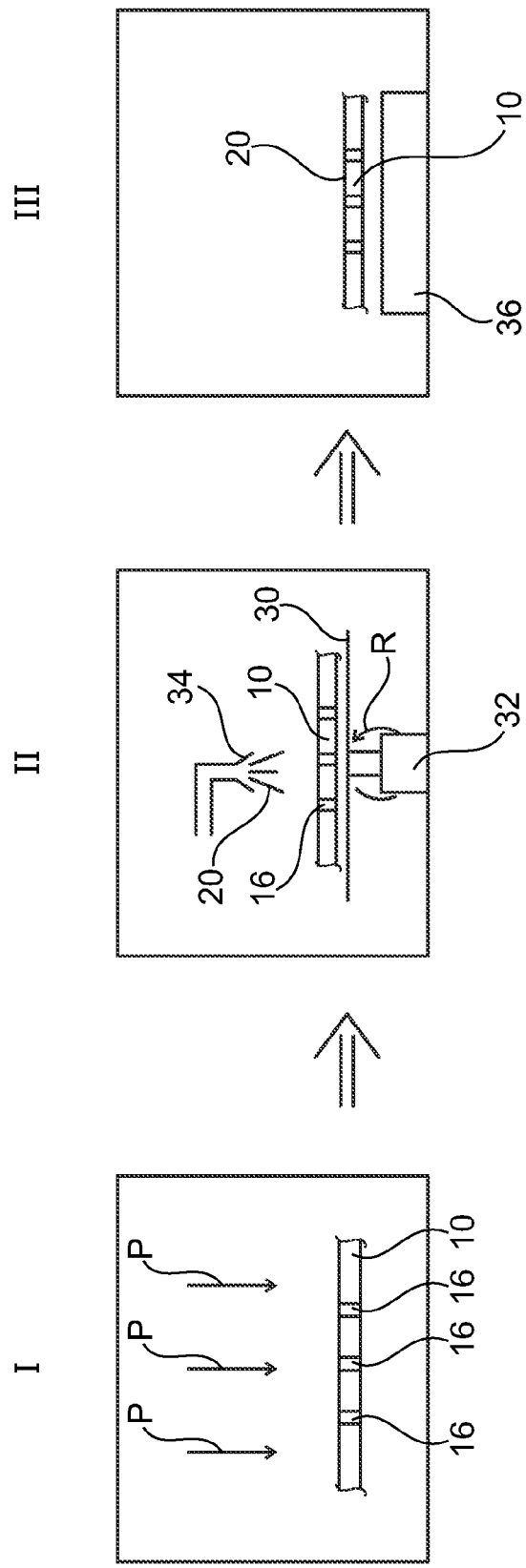
FIG. 2 schematically shows the method according to the invention.

FIG. 2 schematically shows the method by which the electrically insulating material 20 can be applied in such a way that it completely fills the via 16.

In a first method step I, the substrate 10 is conditioned. This is shown schematically here by the arrows P. The conditioning may be carried out by plasma-treating or oxidising the substrate 10. The conditioning may also be carried out by applying a solvent. Combinations of these two variants are also possible.

After the conditioning, the substrate 10 is transported onwards into another treatment station, in which it is coated with the electrically insulating material (method step II).

The coating may be applied by spin-coating, in such a way that the substrate 10 is arranged on a support 30 which can be set in rotation by a motor 32 (see arrow R). The desired electrically insulating material is being applied to the substrate 10 to the rotating substrate 10 using a nozzle 34.

Subsequently, the substrate 10 is transported onwards into yet another treatment station in which the electrically insulating material is cured (method step III). The electrically insulating material 20 may in particular be cured by exposing it to UV light or heat (see the schematically shown heat source 36).

FIG. 3 shows method step I in detail. In the conditioning embodiment shown here, the substrate 10 is coated with a solvent 40 by spin-coating. This takes place at atmospheric pressure.

For coating, the substrate 10 may be arranged on a support 42 which can be set in rotation by a motor 44 (again, see arrow R).

The solvent may for example be acetone, PGMEA (1-methoxy-2-propylacetate), ethyllactate or NMP (N-methyl-pyrrolidone).

After the solvent 40 is applied, the substrate 10 is transported onwards into a vacuum chamber 50 where it is deposited on a support 52 which may be provided with a heater 54 (shown schematically). The substrate 10 (and thus the solvent 40 applied thereto) can be heated using the heater 54, for example to temperatures of >30° C.

When the substrate 10 is introduced into the vacuum chamber 50, said chamber 50 is evacuated. A schematically shown vacuum pump 56 or a Venturi nozzle may be used for this purpose. In one embodiment, the pressure may be reduced from atmospheric pressure to a pressure of approximately 0.3 bar (see also FIG. 4).

When the vias are being evacuated, part of the air located therein is also sucked out. This also locally influences the layer of solvent 40 located on the substrate 10.

When the desired vacuum has been achieved, the pressure in the vacuum chamber 50 is kept constant or a predetermined holding time ($t_1$ to $t_2$). The holding time may for example be approximately 10 to 60 s. During this holding time, the air bubble which is initially enclosed under a solvent layer in the via 16 migrates upwards whilst solvent 40 migrates downwards into the via 16. As a result, the walls of the via are completely wetted with solvent 40.

The rise of the air bubble which is initially enclosed in the via can be assisted by heating the substrate 10. This causes the air bubble in the via to expand even more than it already does because of the reduction in air pressure in the vacuum chamber.

Once the holding time has elapsed, the vacuum chamber 50 is ventilated again, causing the pressure therein to rise to atmospheric pressure. In the process, air is drawn into the vias 16, also drawing solvent into the vias. This ensures that the solvent 40 completely wets the walls of the vias 16.

Once the vacuum chamber 50 is back at the initial pressure, the substrate 10 is removed and transported to a further treatment station in which method step II, in other words the coating with the electrically insulating material 20, can be carried out. Since the walls of the vias 16 are wetted with the solvent, the electrically insulating material 20 flows into the vias 16 very well and fills them up completely. As a result, there are no problems due to air inclusions or the like, and so the electrically insulting material 20 has an (at least almost) planar surface even in the region of the vias 16.

The invention claimed is:

1. A method for coating a substrate provided with vias, wherein the following steps are carried out:
   the substrate is conditioned to improve flowability of an electrically insulating material to be filled into the vias;
   the substrate is coated with the electrically insulating material such that the vias are filled up completely with the electrically insulating material in such a way that the electrically insulating material has as a flat surface, wherein the vias connect electrically conductive structures on a first side of the substrate to electrically conductive structures arranged on a second side of the substrate.

2. The method of claim 1 wherein said conditioning step takes place at atmospheric pressure.

3. The method of claim 1 wherein said substrate is plasma-treated to condition it.

4. The method of claim 1 wherein said substrate is oxidised to condition it.

5. The method of claim 1 wherein a solvent is applied to the substrate to condition it.

6. The method of claim 5 wherein said substrate is subjected to a combination of a plasma-treatment and an application of a solvent.

7. The method of claim 5 wherein said substrate is subjected to a combination of an oxidation-treatment and an application of a solvent.

8. The method of claim 5 wherein said solvent is applied by spin-coating.

9. The method of claim 5 wherein said substrate provided with said solvent is introduced into a vacuum chamber, a pressure in said vacuum chamber being reduced, and said vacuum chamber being ventilated again after a holding time.

10. The method of claim 9 wherein said pressure in the vacuum chamber is reduced by 0.1 to 0.9 bar from an atmospheric pressure.

11. The method of claim 9 wherein said holding time is approximately 10 s to 60 s.

12. The method of claim 9 wherein said substrate is heated in said vacuum chamber.

13. The method of claim 12 wherein said substrate is heated to a temperature of >30° C.

14. The method of claim 5 wherein after said solvent has been applied, said substrate is transported into a different chamber, said substrate being coated within said different chamber with said electrically insulating material.

15. The method of claim 1 wherein said electrically insulating material is applied by spin-coating.

16. The method of claim 1 wherein said electrically insulating material is at least one of a dielectric, a resist and an epoxy resin.

17. The method of claim 1 wherein said electrically insulating material is cured after being applied.

18. A method for coating a substrate provided with vias, wherein the following steps are carried out:
   the substrate is conditioned to improve flowability of an electrically insulating material to be filled into the vias by applying a solvent to the substrate;
   the substrate is coated with an electrically insulating material such that the vias are filled up completely with the electrically insulating material in such a way that the electrically insulating material has as a flat surface, wherein the vias connect electrically conductive structures on a first side of the substrate to electrically conductive structures arranged on a second side of the substrate.

19. A method for coating a substrate provided with vias, wherein the following steps are carried out:
   the substrate is conditioned to improve flowability of an electrically insulating material to be filled into the vias by applying a solvent to the substrate;
   the substrate is coated with an electrically insulating material such that the vias are filled up completely with the electrically insulating material in such a way that the electrically insulating material has as a flat surface, wherein the vias connect electrically conductive structures on a first side of the substrate to electrically conductive structures arranged on a second side of the substrate, and
   wherein said substrate provided with said solvent is introduced into a vacuum chamber, a pressure in said vacuum chamber being reduced, and said vacuum chamber being ventilated again after a holding time.

* * * * *